United States Patent [19]
Miedema

[11] 4,153,886
[45] May 8, 1979

[54] NINETY DEGREE PHASE STEPPER

[75] Inventor: Hotze Miedema, Boxford, Mass.

[73] Assignee: Bell Telephone Laboratories, Incorporated, Murray Hill, N.J.

[21] Appl. No.: 878,528

[22] Filed: Feb. 17, 1978

[51] Int. Cl.[2] .......... H01P 1/18; H01P 1/38; H03H 7/30; H01P 5/16

[52] U.S. Cl. .......... 333/156; 333/103; 333/117

[58] Field of Search .......... 333/31 R, 31 A, 1.1, 333/1, 6, 7 R, 7 D, 8, 10, 11

[56] References Cited

U.S. PATENT DOCUMENTS

| | | | |
|---|---|---|---|
| 2,786,133 | 3/1957 | Dyke | 333/31 A X |
| 3,058,071 | 10/1962 | Walsh et al. | 333/11 |
| 3,582,790 | 6/1971 | Curtis | 333/11 X |
| 3,718,873 | 2/1973 | Garver | 333/31 R |
| 3,996,533 | 12/1976 | Lee | 333/31 R X |
| 4,004,255 | 1/1977 | Chapnikoff | 333/31 R |
| 4,088,970 | 5/1978 | Fassett et al. | 333/31 R |

*Primary Examiner*—Alfred E. Smith
*Assistant Examiner*—Marvin Nussbaum
*Attorney, Agent, or Firm*—Sylvan Sherman

[57] ABSTRACT

A 90 degree phase stepper is described comprising a tandem array of one 90 degree hybrid coupler and one 180 degree hybrid coupler. A phase shifter, capable of introducing either zero or 180 degrees of phase shift, is included in each of the two wavepaths connecting the two couplers. By the appropriate selection of phase shifts, the phase of the output signal can be continuously increased or decreased in 90 degree or 180 degree increments.

5 Claims, 2 Drawing Figures

NINETY DEGREE PHASE STEPPER

TECHNICAL FIELD

This invention relates to phase shifters capable of producing continuously steppable phase shifts of 90 and 180 degrees in either direction.

BACKGROUND ART

It is well known that radio waves, propagating from a transmitter to a receiver, can follow a plurality of differing paths, and that the relative phases of the different waves arriving at the receiving antenna can be such as to destructively interfere, causing what is commonly referred to as a fade. In order to reduce the opportunity for this to occur, the so-called "space diversity" system has been developed using two, spaced antennas to feed a common receiver. The theory underlying the use of two spaced-apart antennas is that there is less likelihood that a fade will occur at both antennas at the same time. In the simplest system, means are provided to disconnect the receiver from the antenna as soon as the received signal level falls below a predetermined threshold level and to connect the receiver to the second antenna. In this so-called "blind switching," it is assumed that the signal received by the second antenna is stronger than that received by the first antenna. In a more sophisticated system, the signals from the two antennas are combined at radio frequency instead of switching between the two. This eliminates amplitude and phase jumps associated with the switching operation, and has the added advantage of delivering a larger amplitude signal to the receiver. However, such a system requires the use of dynamic phase correction to compensate for variations in the relative phase of the two signals caused by changes in the path lengths traversed by them. In one such system, described in U.S. Pat. No. 2,786,133, a single, continuously adjustable phase shifter is included in one of the antenna wavepaths and is automatically adjusted so that the wave from the one antenna has the proper phase to combine with the wave from the other antenna. U.S. Pat. No. 3,582,790 shows, in greater detail, a means for combining the two received signals and for isolating the two antennas from each other. The circuit includes a first phase shifter which shifts the phase of one of the input signals to bring it into quadrature relationship with the other. The quadrature related signals are combined in a first hybrid coupler to produce a pair of equal amplitude signals. The phase of one of the two signals is then shifted 90 degrees by a second phase shifter so as to bring the two signals in phase. The two equal, in-phase signals are then combined in a second hybrid coupler to produce a single output signal whose total power is equal to the sum of the powers of the two received signals.

Both of these systems seek to track the two signals continuously and do so by means of continuously variable phase shifters. The problem with such phase shifters is that in order to go from maximum phase shift back to zero, they must go through all values therebetween. To illustrate the problem, consider two waves whose relative phase difference is slowly increasing. As the phase increases, it will eventually reach 360 degrees at which point the two signals are again in phase. However, a phase shifter such as the type illustrated in U.S. Pat. No. 2,786,133 does not ease past its maximum phase shift to zero phase shift but, instead, must be reset by going completely through its entire range of phase shift from its maximum setting to its minimum setting, causing a sudden fluctuation in the amplitude of the output signal, including the possibility of signal cancellation. What is desired is a phase shifter which is capable of providing increasing or decreasing phase shifts without a return-toward-zero requirement.

The return-toward-zero problem is also present in other types of continuously variable phase shifters. For example, U.S. Pat. No. 3,419,823 shows a phase shifter comprising a tandem array of a 90 degree hybrid coupler and a 3 dB, 180 degree hybrid coupler. In this embodiment, the phase of the output signal is controlled by either changing the power division ratio of the 90 degree coupler, or by changing the attenuation in one of the two wavepaths connecting the two couplers. In either case, the return-toward-zero problem is not resolved by the phase shifter described in this patent.

Before proceeding with a discussion of the present invention, mention should be made of the switching circuit disclosed in U.S. Pat. No. 3,058,071. While the function of this system is to switch an input signal between one of two output paths, rather than to produce a variable phase shift, the circuit is similar to a phase shifter in accordance with the present invention, as will be described hereinbelow. Specifically, the switch comprises a tandem array of three, 3 dB hybrid couplers, including variable phase shifters in the two wavepaths connecting the first and second of the couplers. By varying the phase shift between zero and 90 degrees, the output of the switch can be controlled. However, as noted hereinabove, this circuit is designed to control the amplitude, not the phase of the output signal.

SUMMARY OF THE INVENTION

A phase stepper in accordance with the present invention comprises a 3 dB, 90 degree hybrid coupler; a 3 dB, 180 degree hybrid coupler; and first and second variable phase shifters connecting one pair of conjugate ports of one of the couplers to one pair of conjugate ports of the other coupler. The invention is characterized in that the differential phase shift introduced by the phase shifters is either zero degrees or 180 degrees. By the appropriate selection of phase shifts in the two phase shifters, the phase of the output signal can be made to step in 90 degree increments in either direction, thus avoiding the return-toward-zero disadvantages of the prior art phase shifters.

DETAILED DESCRIPTION

Figure 1:
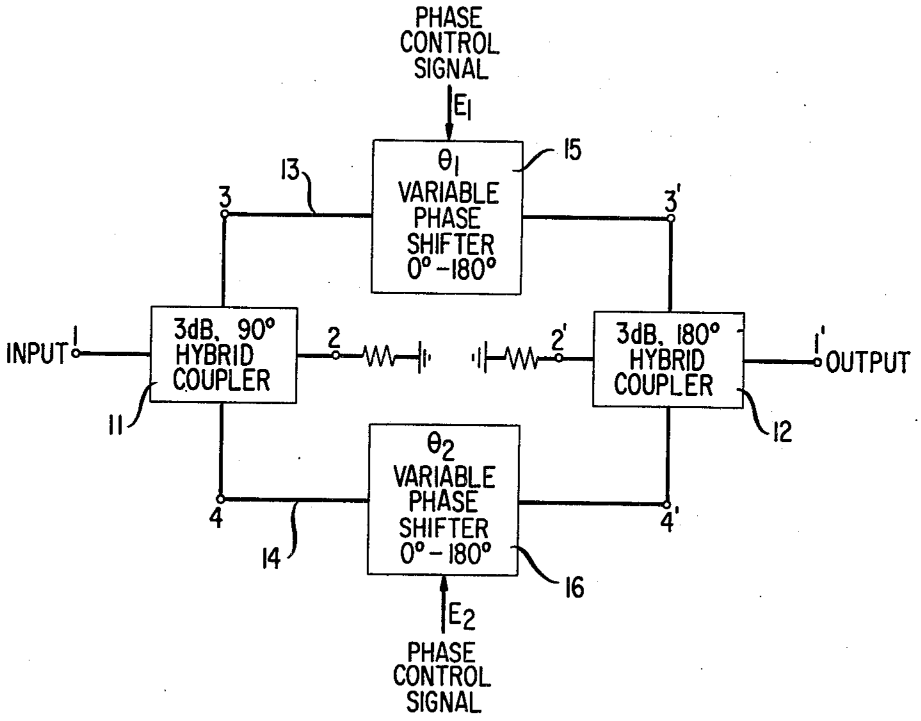
FIG. 1 shows a 90 degree phase stepper in accordance with the present invention.

Referring to the drawings, FIG. 1 shows a 90 degree phase stepper in accordance with the present invention comprising a 3 dB, 90 degree hybrid coupler 11 and a 3 dB, 180 degree hybrid coupler 12 connected in tandem by means of a pair of variable phase shifters 15 and 16. The term "3 dB, hybrid coupler" refers to that class of power dividing network having two pairs of conjugate branches 1–2 and 3–4 wherein the power of an incident signal applied to one branch of one pair of conjugate branches divides equally between the other pair of conjugate branches, with none of the power appearing at the fourth branch. In a 90 degree coupler, the phase of the signals in the two branches differs by 90 degrees. A 180 degree coupler, on the other hand, is characterized by an inherent asymmetry such that the signals in the two branches are either in-phase or differ by 180 degrees. In a "tandem" connection, the branches of one pair of conjugate branches of one of the couplers are connected, respectively, to the branches of one pair of conjugate branches of the other coupler. Thus, in the embodiment of FIG. 1, conjugate branches 3–4 of coupler 11 are connected to conjugate branches 3'–4' of coupler 12 by means of wavepaths 13 and 14, each of which includes one of the variable phase shifters 15, 16. Of the other pairs of conjugate branches, branch 1 of coupler 11 constitutes the input port of the phase stepper while branch 1' of coupler 12 constitutes the output port. Branches 2 and 2' are resistively terminated.

In operation a unit signal applied at branch 1 of coupler 11 produces a first signal $\sqrt{2}/2\angle 90°$ at one of the branches 3, and a second signal $\sqrt{2}/2\angle 0°$ at branch 4. The two signals appear at branches 3' and 4' of coupler 12, as $\sqrt{2}/2\angle 90°+\theta_1$ and $\sqrt{2}/2\angle\theta_2$, respectively, where $\theta_1$ and $\theta_2$ are the differential phase shifts introduced by the phase shifters 15 and 16. These, in turn, combine in branches 1' and 2' to produce a sum signal $\frac{1}{2}\angle 90°+\theta_1+\frac{1}{2}\angle\theta_2$ in one of the branches 1', and a difference signal $\frac{1}{2}\angle 90°+\theta_1-\frac{1}{2}\angle\theta_2$ in the other branch 2'. Inasmuch as $\theta_1$ and $\theta_2$ can only have the values of zero or 180 degrees, the four possible phases of the signal in output branch 1' of coupler 12 are as given in Table 1.

Table 1

| $\theta_1$ | $\theta_2$ | Output Signal Phase |
|---|---|---|
| 0° | 0° | 45° |
| 0° | 180° | 135° |
| 180° | 0° | 315° |
| 180° | 180° | 225° |

It will be noted from Table 1 that the phase of the output signal can be changed continuously, in either direction, in 90 degree increments by the appropriate combination of $\theta_1$ and $\theta_2$. Specifically, a phase step of 90 degrees is obtained whenever $\theta_1$ or $\theta_2$ changes.

Figure 2:
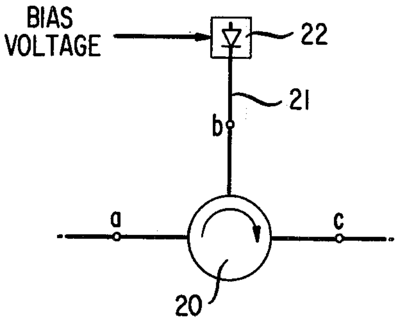
FIG. 2 shows one embodiment of a 0–180 degree differential phase shifter for use with the phase stepper of FIG. 1.

FIG. 2 shows one embodiment of a phase shifter for introducing zero or 180 degrees of differential phase shift in the interconnecting wavepaths 13 and 14. The phase shifter comprises a three-port circulator 20 and a length of transmission line 21 connected to one of the circulator ports b at one end, and terminated by means of a PIN diode 22 at its other end.

In operation, a signal applied to circulator port a leaves the circulator at port b, traverses the length of line 21 and is reflected back to the circulator by the diode. The reflected signal reenters the circulator at port b and exits from port c. The total phase shift through this circuit depends upon the length of transmission line 21 and the state of conduction of diode 22. In particular, the phase shift differs by 180 degrees, depending upon whether the diode is in a low conduction state, i.e., appears as an open circuit, or a high conduction state, i.e., appears as a short circuit. Thus, by controlling the conduction state of the diode, by means of an externally applied bias voltage, the phase of the output signal from the phase shifters can be varied by 180 degrees. The bias voltage can either be controlled manually, or automatically in response to some monitored parameter.

In the particular embodiment of FIG. 1, the 90 degree hybrid coupler is employed as the input coupler, whereas the 180 degree coupler serves as the output coupler. However, it can be readily shown that the two couplers can be interchanged without changing the basic operation of the phase stepper.

What is claimed is:

1. A 90 degree phase stepper comprising
a tandem array of a 90 degree hybrid coupler and a 180 degree hybrid coupler, each of which has two pairs of conjugate branches;
first and second variable phase shifters connecting one pair of conjugate branches of one of said couplers to one pair of conjugate branches of the other of said couplers;
CHARACTERIZED IN THAT
said phase shifters are capable of introducing differential phase shifts of only zero and 180 degree.

2. The phase stepper according to claim 1 wherein
one branch of the other pair of conjugate branches of said 90 degree hybrid coupler is the input port of said stepper;
and one branch of the other pair of conjugate branches of said 180 degree hybrid coupler is the output port of said stepper.

3. The phase stepper according to claim 1 wherein
one branch of the other pair of conjugate branches of said 180 degree hybrid coupler is the input port of said stepper;
and one branch of the other pair of conjugate branches of said 90 degree hybrid coupler is the output port of said stepper.

4. The phase stepper according to claim 1 wherein each phase shifter comprises:
a circulator having one port connected to one hybrid coupler;
a second port connected to a length of transmission line terminated by means of a PIN diode;
and a third port connected to the other hybrid coupler.

5. The stepper according to claim 4 including means for switching said PIN diode between a high and a low conductivity state.

* * * * *